United States Patent [19]

Lin

[11] Patent Number: 5,760,633

[45] Date of Patent: Jun. 2, 1998

[54] LOW POWER LOW NOISE CIRCUIT DESIGN USING HALF $V_{DD}$

[75] Inventor: Shen Lin, Yorktown Heights, N.Y.

[73] Assignee: International Business Machines Corporation, Armonk, N.Y.

[21] Appl. No.: 757,233

[22] Filed: Nov. 27, 1996

Related U.S. Application Data

[63] Continuation of Ser. No. 488,671, Jun. 8, 1995, abandoned.

[51] Int. Cl.[6] .................................................. H03K 17/687
[52] U.S. Cl. .................................................. 327/389; 327/111
[58] Field of Search .................................. 327/170, 374, 327/376, 391, 389, 390, 392, 126; 325/27, 17, 40, 34; 365/203, 204, 230.06, 189.11

[56] References Cited

U.S. PATENT DOCUMENTS

| | | | |
|---|---|---|---|
| 3,621,291 | 11/1971 | Fujimoto | 327/111 |
| 4,408,135 | 10/1983 | Yuyama et al. | 326/60 |
| 4,731,553 | 3/1988 | Van Lehn et al. | 326/27 |
| 4,814,647 | 3/1989 | Tran | 365/203 |
| 4,880,997 | 11/1989 | Steele | 326/27 |
| 5,237,213 | 8/1993 | Tanoi | 327/205 |
| 5,257,232 | 10/1993 | Dhong et al. | 365/226 |
| 5,414,312 | 5/1995 | Wong | 327/170 |
| 5,430,404 | 7/1995 | Campbell et al. | 327/170 |

OTHER PUBLICATIONS

A.P. Chandrakasan et al "Design of Portable Systems", IEEE 1994 Custom Integrated Circuits Conf. pp. 259–266.

R. F. Lyon "Cost, Power, and Parallelism in Speech Signal Processing" IEEE 1993 Custom Integrated Circuits Conf. pp. 15.1.1–15.1.9.

Primary Examiner—Timothy P. Callahan
Assistant Examiner—My-Trang Nu Ton

[57] ABSTRACT

A power saving technique for digital integrated circuit designs by employing another power supply that is equal to half $V_{dd}$. The power supply switching noises can also be reduced by the technique. Also disclosed are the driver design and the pre-charging bus driver design that implement this power-saving technique.

8 Claims, 10 Drawing Sheets

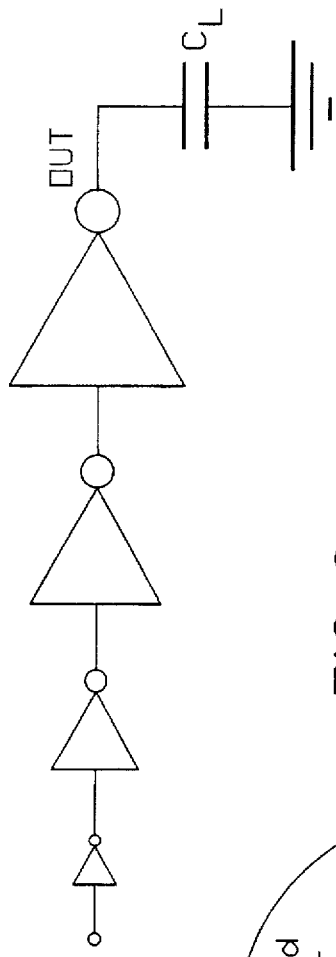
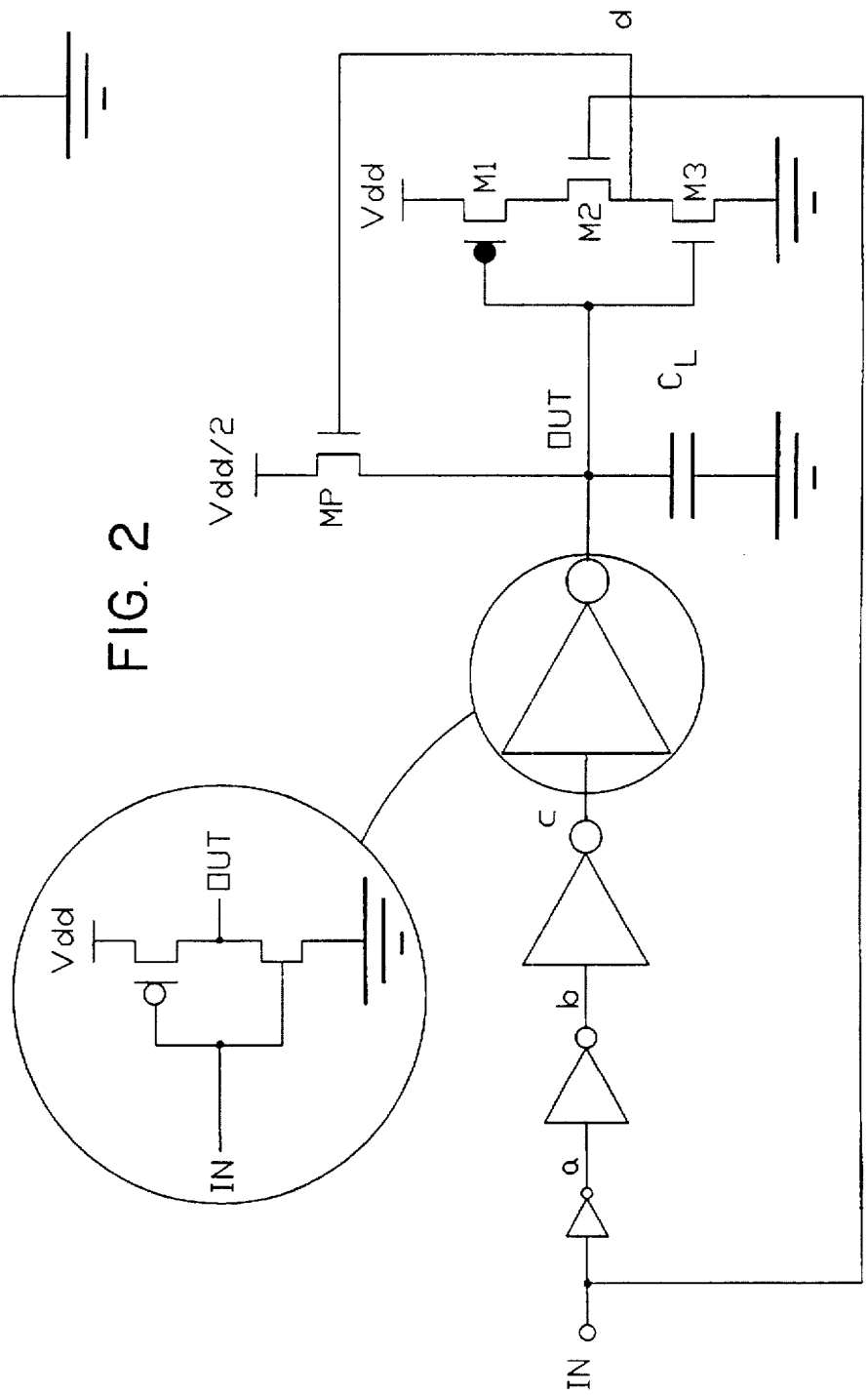
FIG. 1
FIG. 2

LOW POWER LOW NOISE CIRCUIT DESIGN USING HALF $V_{DD}$

This is a continuation of application Ser. No. 08/488,671 filed on Jun. 8, 1995 now abandoned.

FIELD OF THE INVENTION

The invention relates to the design of digital integrated circuits.

BACKGROUND OF THE INVENTION

Portable applications have shifted from conventional low performance products such as calculators and wristwatches to high throughput, computationally intensive products such as notebook computers and personal digital assistants. These new applications require low power consumption mainly due to the restrictions of the limited battery lifetimes and their limited cooling systems. Research on low power design, hence, has been drawing a lot of attention.

On the other hand, as the state-of-the-art VLSI technology puts more and more devices into larger and larger chips, insufficient on-chip AC return paths become a severe problem. An instantaneous large current needs to be drawn from the power bus at the packaging to the chip. This is prohibited by the packaging inductance and, hence, leads to significant power-supply switching noises in today's high performance circuits. Those large on-chip current sinks, such as heavily loaded drivers, are often the hot spots for power consumption.

SUMMARY OF THE INVENTION

Disclosed is a power saving method for digital integrated circuit designs by employing a $V_{dd}$ source and a half $V_{dd}$ source. Rising signals are charged up in two steps. In the first step, the signals are charged to half $V_{dd}$ through the half $V_{dd}$ power supply and then, in the second step, the signals are charged to $V_{dd}$ through the $V_{dd}$ source. 25% power can be saved in the best case. Since the voltage swing in each step is half $V_{dd}$, the peak supply-current demand from the packaging is decreased, which reduces the power supply switching noises.

Also disclosed are a driver design and a pre-charging bus driver design implementing this power-saving technique. They have the advantages of (1) no sacrifice in the performance, (2) very small increase in the active area, and most importantly, (3) minimal modification needed on original circuit designs.

FIGURES

FIG. 1 is a conventional prior art.

FIG. 2 is a low power driver in accordance with the present invention employing half-$V_{dd}$.

DETAILED DESCRIPTION

Figure 3:
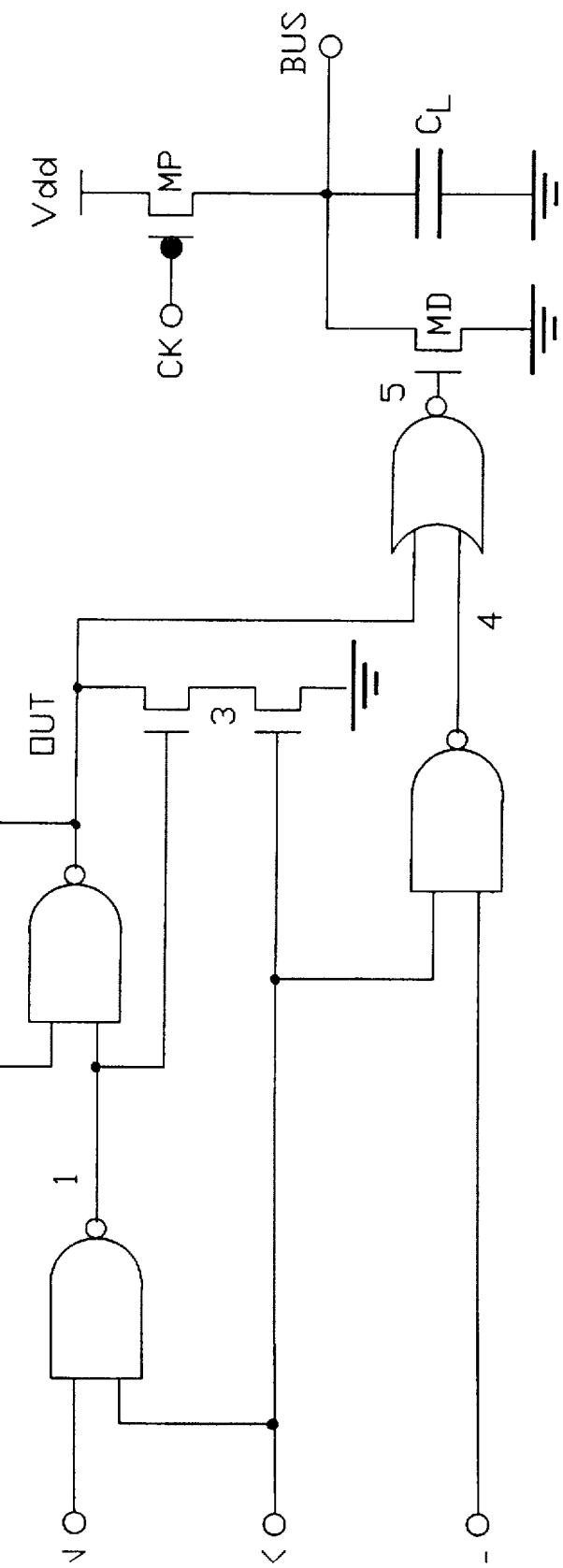
FIG. 3 is a conventional prior art pre-charging bus design.

In this invention, I present a technique to alleviate the above noted problems associated with prior art low power devices. Using an extra power supply that is equal to half $V_{dd}$ is proposed. Rising signals are charged up in two steps. In the first step, the signals are charged to half $V_{dd}$ through this extra power supply and then, in the second step, the signals are charged to $V_{dd}$ through the $V_{dd}$ source. Since the voltage swing in each step is only half $V_{dd}$, the peak supply-current demand from the packaging is decreased.

The energy consumed at the battery to charge up a signal is roughly given by $$CV^2,$$

where C is the total capacitive loading, and V is the supply voltage ($V_{dd}$). The product $V^2$ is equal to the supply voltage multiplied by the voltage swing. Therefore, if we can charge up the rising signal in two steps as described above, the energy consumption for the first step is $$c(V_{DD}/2)(V_{DD}/2),$$

and that for the second step is $$CV_{dd}(V_{dd}/2).$$

Hence, the total energy consumption is $$\tfrac{3}{4}CV_{dd}^2,$$

which is a 25% saving over the case in which only a level of $V_{dd}$ is employed. The choice of this extra supply to be half $V_{dd}$ is optimal because the function $$x^2+(1-x)$$

reaches its minimum 0.75 when x=0.5, where x is the ratio of the extra supply voltage relative to $V_{dd}$.

In this invention, I also present a driver design and a pre-charging bus driver design that implement the proposed power-saving technique. The driver can be used to repower heavily loaded signals, such as clock. Since in today's digital circuits, roughly 70% of the power is consumed on the clock distribution and the heavily loaded buses, a significant amount of power can be saved by employing the two driver designs. The proposed drivers can replace those heavily loaded drivers of existing designs, leaving the rest without change. The half-$V_{dd}$ power bus is only connected to the new drivers. Only minimal modifications are needed on the original circuits.

The two driver designs also have the advantages of (1) no sacrifice in the performance, and (2) very small increase in the active area. Their implementations are presented in the next section.

Implementation

Driver Design

FIG. 1 shows the design of a conventional minimal-delay driver driving a large capacitive loading $C_L$. The driver is composed of an even number of serially connected inverters. In this example, the sizes of the inverters are monotonically increasing from the input side of the driver to the output with a ratio of about 2.8. Therefore, each inverter is driving the loading roughly equal to 2.8 times its input loading. The number of inverters needed, hence, can be determined. The width of the PMOS of each inverter is about twice that of the NMOS to keep the rise time and the fall time the same because the N-type mobility is about two times larger.

FIG. 2, on the other hand, shows a driver in accordance with the present invention employing an extra half-$V_{dd}$ power supply. The half-$V_{dd}$ supply is only connected to the NMOS transistor MP. Depending on the loading $C_L$, there can be any even number of inverters between the nodes IN and OUT. There are four inverters for the example of FIG. 2. In the preferred embodiment of FIG. 2, the sizes of the inverters are also monotonically increasing with the ratio of about 2.8 (although this needn't be the case for the invention to operate). In contrast with the driver of FIG. 1, the width of the PMOS of the last inverter, with OUT as its output node, is smaller than twice that of the inverter's NMOS because this PMOS only needs to charge up the node OUT from half $V_{dd}$ to $V_{dd}$. It is the NMOS MP that charges up OUT to half $V_{dd}$. Therefore, the total area of the four inverters is smaller than the total area of the four inverters shown in FIG. 1, which compensates for the area used by M1, M2, M3, and MP. Moreover, since the area of the first inverter is smaller than that of the first inverter in FIG. 1, the loading looking at the input node IN for both cases will be roughly the same. (The NMOS M2, also connected to in, is very small.)

Let us see how the driver operates. First, let us consider the situation where IN is low. M2 is OFF so d is low and MP is OFF. Therefore, OUT is low, which is correct.

Secondly, let us consider the situation where IN is changing to high. There will be a time interval when IN is high and OUT is low. This time interval is defined by the delay characteristics of the logic network. M1 and M2 will both be ON, which turns ON MP. The OUT node will be charged up through the half-$V_{dd}$ supply. When the voltage at OUT goes up to about half $V_{dd}$, which charges capacitor $C_L$ to half $V_{dd}$, M1 will be OFF and M3 will be ON, discharging d and hence, turning OFF MP. The PMOS of the last inverter will then take the rest of the responsibility of charging up OUT.

Thirdly, let us consider the situation where IN is going low. Since M2 will be turned OFF before M1 is turned ON, MP will stay OFF. OUT will be discharged through the NMOS of the last inverter. Therefore, the operations of the low power driver are correct and behave as expected to charge up the output node in two steps.

I have chosen the first step-charging device MP to be an NMOS device and the ON voltage at its gate to be approximately $V_{dd}$ to increase the drive capability of MP. Unlike most previous power-saving approaches using lower power supplies, the circuit of the present invention does not sacrifice performance. In the next section, I will demonstrate the amount of power saving and the amount of peak supply-current reduction of the driver design of the present invention over the conventional one.

Pre-charging Bus Driver Design

The pre-charging bus has the advantages of small area and fast speed, and hence, is widely used in high performance circuits. As shown in the prior art pre-charging bus design of FIG. 3, the bus line BUS is charged to $V_{dd}$ through the pre-charging PMOS MP when the clock signal CK is low. When CK is high and SEL is high (meaning this bit line is selected to WRITE to the bus—the select line is provided because many devices may have their outputs connected to node BUS), the voltage at node 5 will be equal to the negation of IN. Therefore, if IN is low, and hence node 5 is high, the NMOS MD will be ON and will discharge node BUS to zero volts. On the other hand, if IN is high, and hence node 5 is low, the high voltage at the pre-charged node BUS is already available. Moreover, since the pre-charging PMOS MP is shared by all the drivers connected to the bus, a significant amount of area can be saved. (Only one of the devices to the right of the dashed line in FIG. 3 is needed to service all bus lines.)

Figure 4:
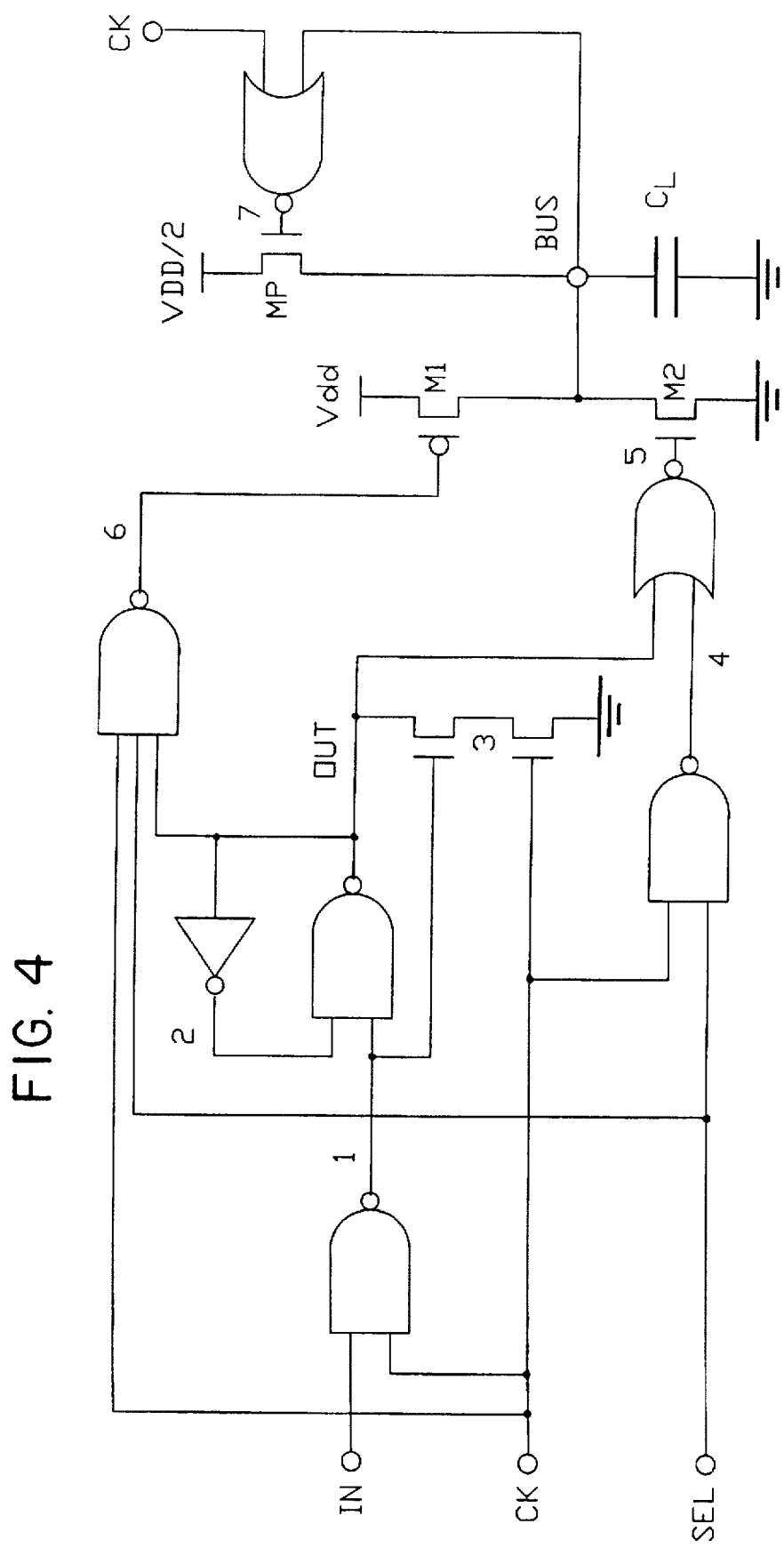
FIG. 4 is a low power low noise pre-charging bus design.

In my low power/low noise bus design, as shown in FIG. 4, BUS is first charged to half $V_{dd}$ through the pre-charging NMOS MP when CK is low. When CK is high and SEL is high, BUS will either be charged from half $V_{dd}$ to $V_{dd}$ through the PMOS M1 (if IN is high), or discharged to zero through the NMOS M2 (if IN is low). When CK is low, both M1 and M2 will be OFF, providing high impedance looking left of the node BUS during the pre-charging phase. When both CK is low and BUS is low, node 7 will be high, turning on MP to pre-charge the bus line. When the bus line is charged to about half $V_{dd}$, node 7 will be pulled down to zero, turning OFF MP.

The saving of the average power by using the pre-charging bus design of the present invention can be more than 25% over the conventional design, depending on the frequency of logic zero appearing on BUS. Every time a logic zero appears on BUS, the energy used to pre-charge the bus line is wasted. In the present design, this energy is equal to $\frac{1}{4}(C_L V_{dd}^2)$ while that for the conventional design is equal to $C_L V_{dd}^2$). Therefore, in the case where 50% of the data are zero (which we commonly assume), the saving by using the present design is 50%. This is because the power consumption on the bus for the conventional design is $\frac{1}{2}(fC_L V_{dd}^2)$, where $\frac{1}{2}$ is due to half of the data are zero and a pre-charging is needed only after a zero, while the power consumption on my bus is $$1/2 fC_L \frac{V_{dd}^2}{4} + 1/4 fC_L \frac{V_{dd}^2}{2} = 1/4 fC_L V_{dd}^2,$$

where the first term is the power used to pre-charge the bus line and the second term is the power used to charge the bus line from half $V_{dd}$ to $V_{dd}$ when the data is one. If the data on the bus line is biased with a larger frequency of zero, the saving will be even larger.

Since the PMOS M1 is responsible only for the charge-up from half $V_{dd}$ to $V_{dd}$, the area increase compared with the design of FIG. 3 is minimal. In the next section, we will show comparisons between my design and the conventional one on both power consumptions and peak currents.

Experimental Results

Figure 5:
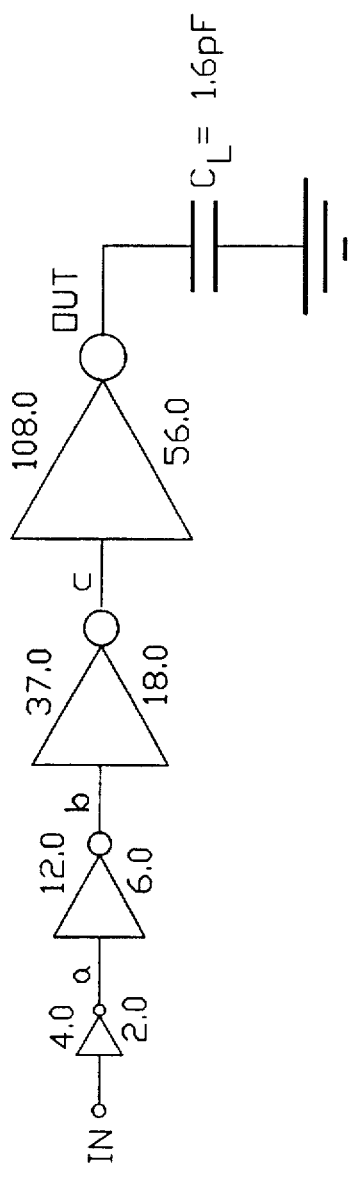
FIG. 5 is a conventional prior art driver circuit.
Figure 7:
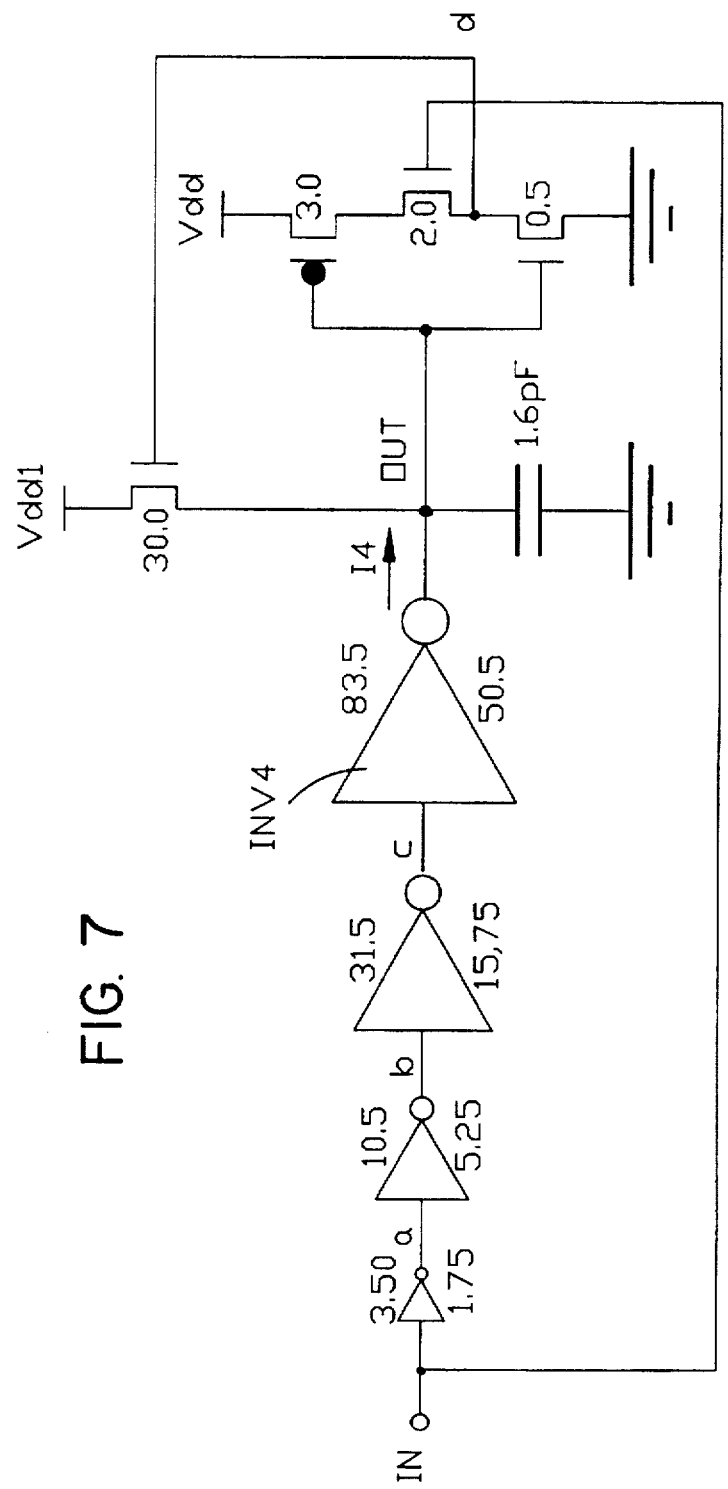
FIG. 7 is a low power low noise driver circuit.
Figure 9:
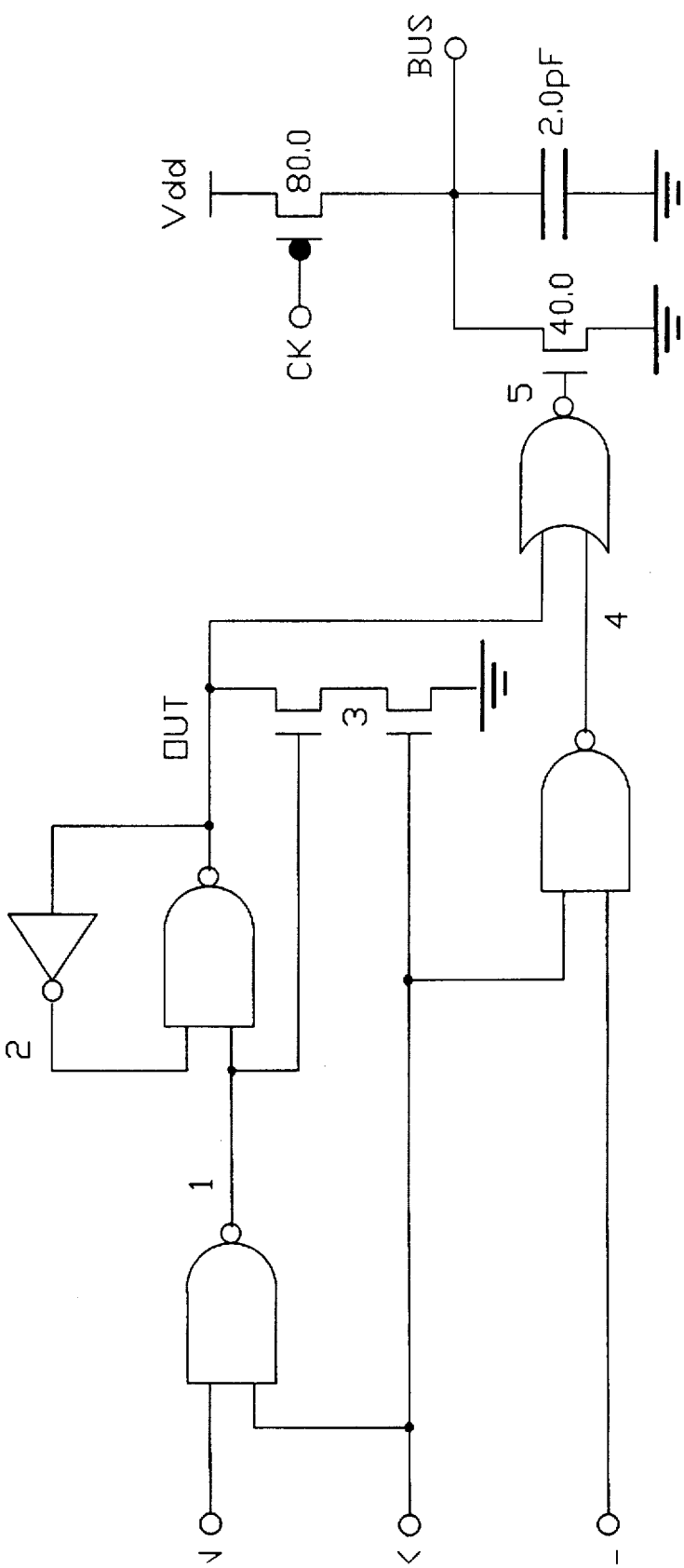
FIG. 9 shows a conventional pre-charging bus circuit.
Figure 11:
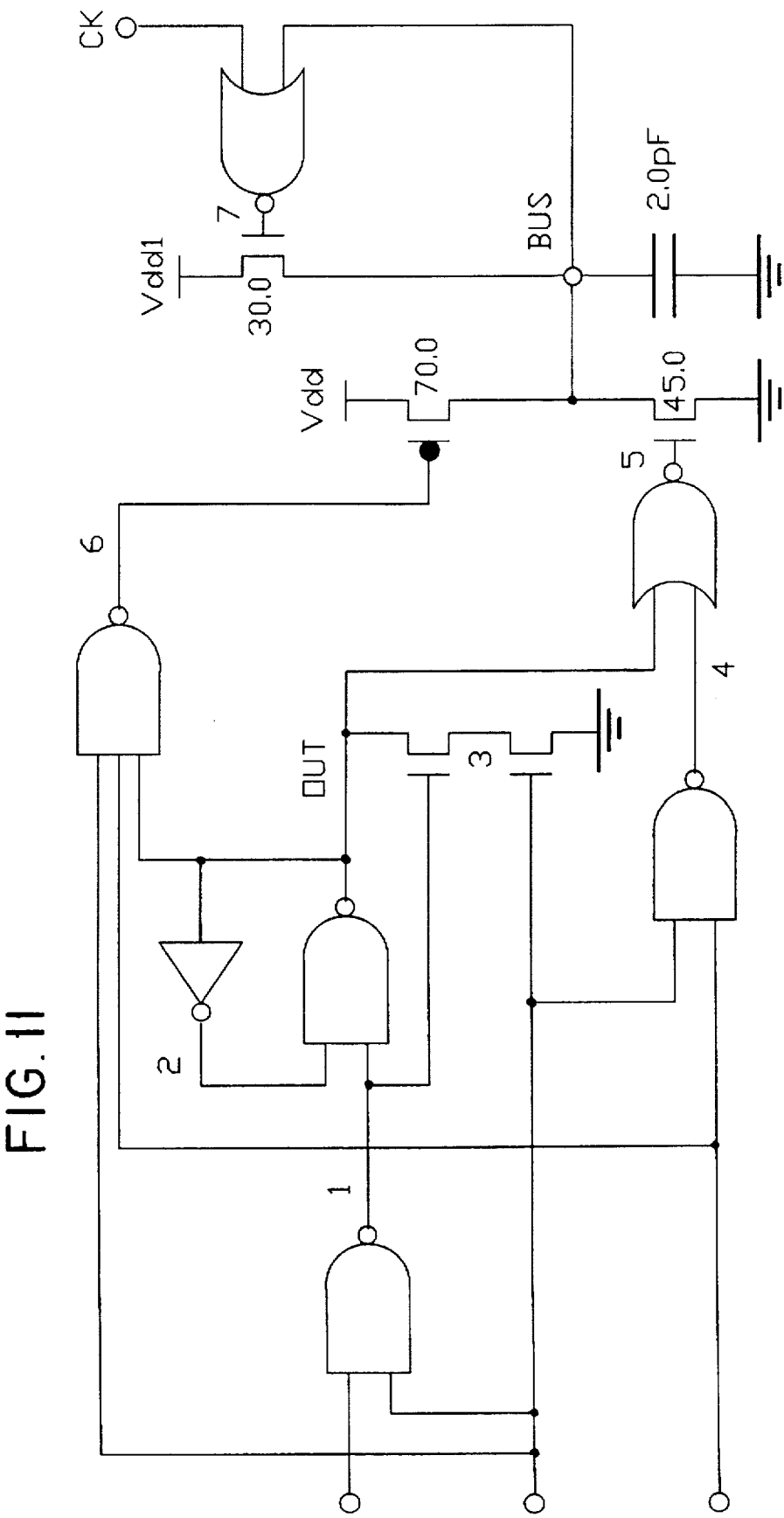
FIG. 11 shows a low power low noise pre-charging bus circuit.

I have implemented the circuit designs of FIG. 1 through FIG. 4 for comparisons by using CMOS technology with 2.5V $V_{dd}$. The circuits are CKT1, CKT2, CKT3, and CKT4, shown in FIG. 5, FIG. 7, FIG. 9, and FIG. 11, respectively. For fair comparisons, the timing performance of FIG. 5 and FIG. 7 are kept the same and so are that of FIG. 9 and FIG. 11.

Low Power/Low Noise Driver

Figure 6:
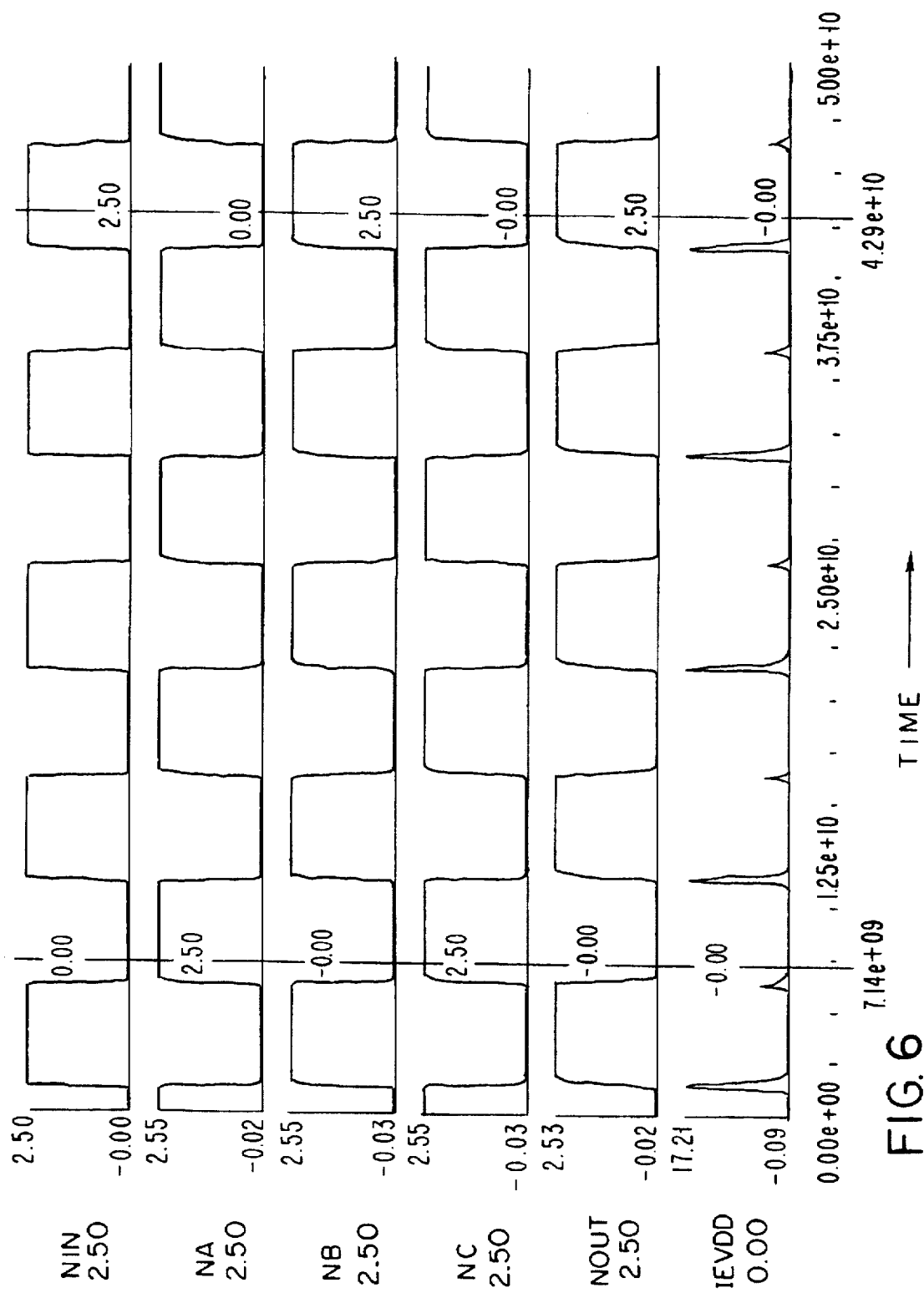
FIG. 6 shows the simulation result of CKT1.
Figure 8:
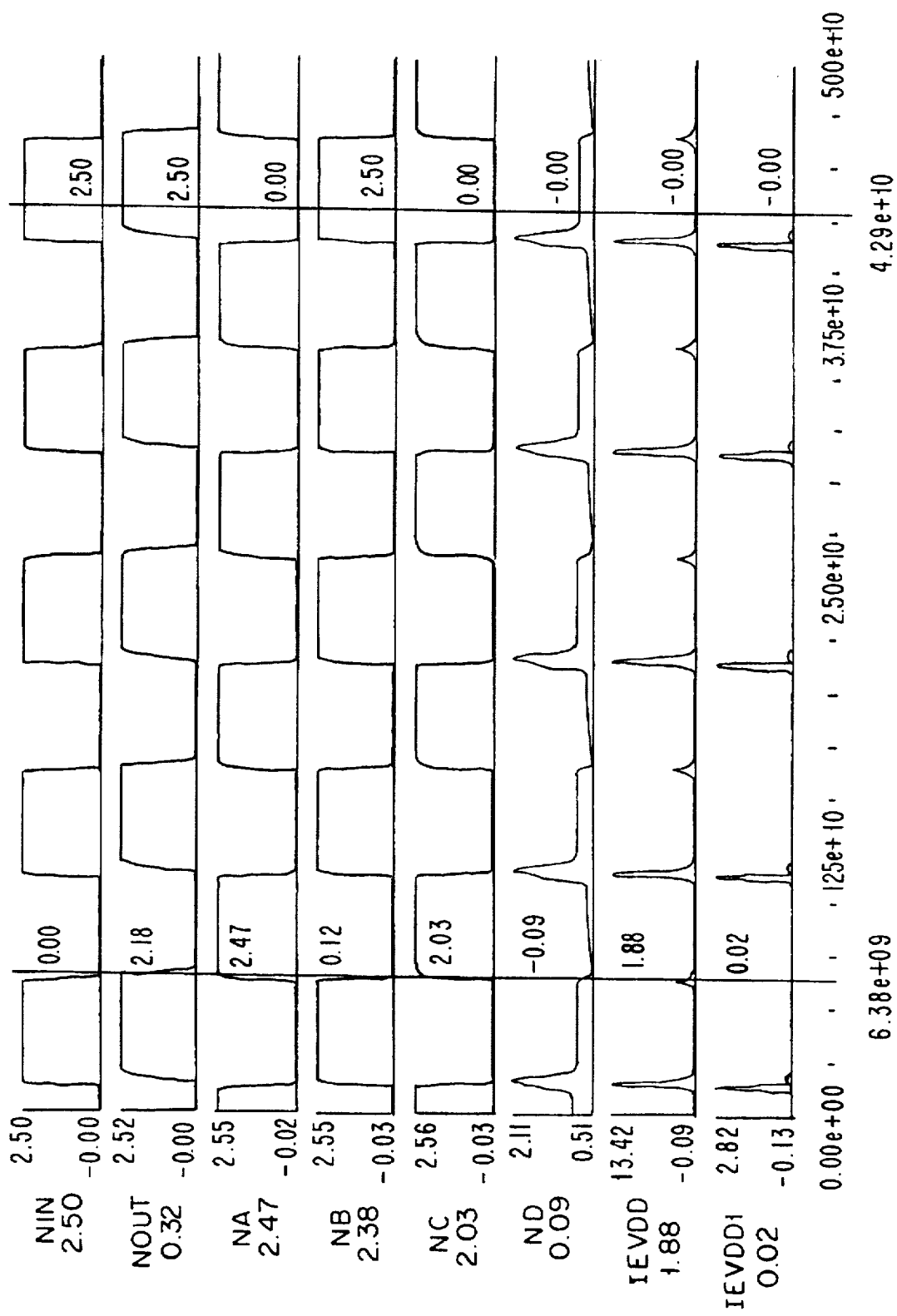
FIG. 8 shows the simulation result of CKT2.

FIG. 6 shows the ASX simulation of CKT1 and FIG. 8 shows that of CKT2. (In each of the ASX plots, the parameters beginning in "N" are voltages, and the parameters beginning in "T", are currents at the respective points) The rising delays from IN to OUT of both drivers are 389 ps and the falling delay of both are 391 ps. The power consumption of CKT1 is 1.97 mW and its peak current is 17.21 25 mA. However, the total power consumption on $V_{dd}$ and $V_{dd}1$ of CKT2 is 1.89 mW, which is 4.1% saving. The peak supply current drawn from the $V_{dd}$ bus is 13.42 mA, which is 22% reduction. Therefore, the switching noise on the $V_{dd}$ power bus will be reduced roughly by this much. The experiment did not achieve the expected 25% power saving because (1) the delay from IN to OUT is too small to fully turn on MP, and (2) the extra power consumed by M1, M2, and MP is not negligible. In the figure, IEVDD1 represents the current flowing from the $V_{dd}1$ source (equal to about ½ $V_{dd}$), and IEVDD represents the current flowing from the $V_{dd}$ source. The current I4 leaving the inverter INV4 makes up a significant portion of the total IEVDD, so the shape of a waveform representing the current I4 would be the same. Thus, it can be seen from the waveforms that The current I4 will begin charging the node OUT to a level near $V_{dd}$ when MP has turned off.

Low Power/Low Noise Pre-charging Bus Driver

Figure 10:
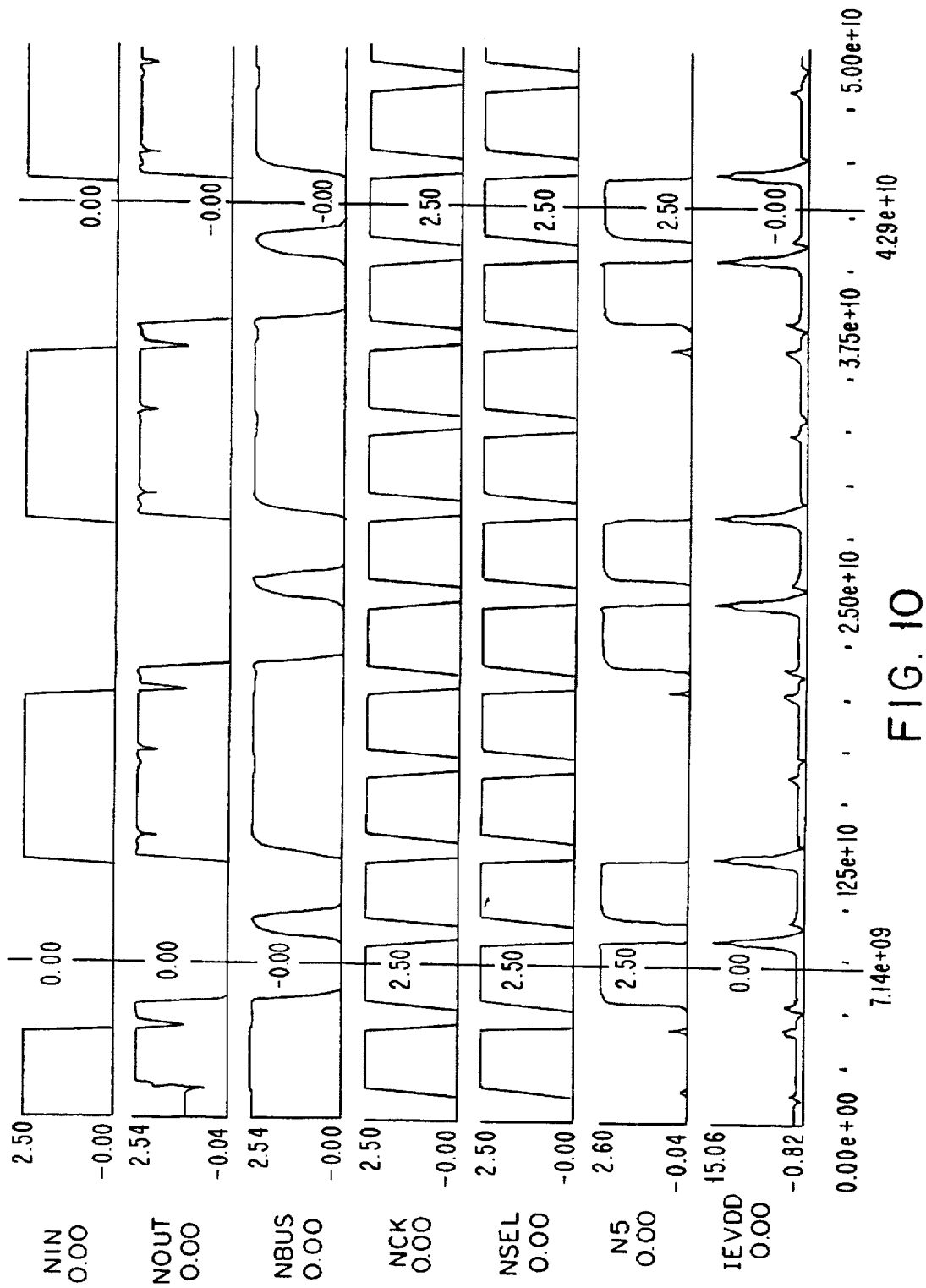
FIG. 10 shows the simulation result of CKT3.
Figure 12:
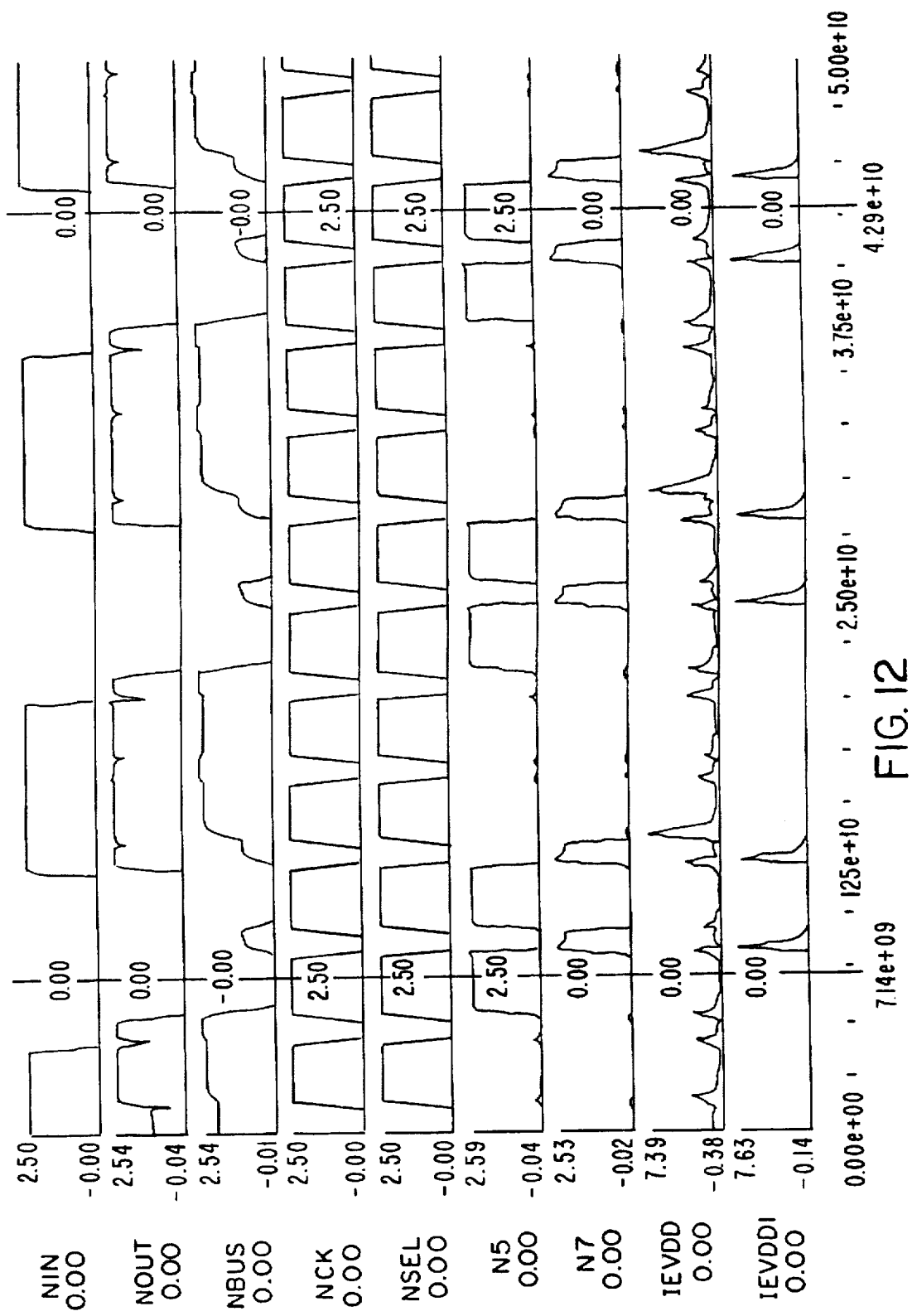
FIG. 12 shows the simulation result of CKT4.

FIG. 10 shows the ASX simulation of CKT3 and FIG. 12 shows that of CKT4. The 50% falling delays from SEL to BUS of both bus designs are 391 ps. (The rising delays are not applicable because the bus lines are pre-charged.) The 50% to 90% rise time of the CKT4 bus is 128 ps. The pre-charging time taken by CKT3 is 300 ps while the pre-charging time taken by CKT4 is 280 ps. The power consumption of CKT3 is 2.29 mW and its peak supply current is 15.06 mA. On the other hand, the total power consumption on $V_{dd}$ and $V_{dd}1$ of CKT4 is 1.58 mW, which represents a 31% saving. The peak supply current drawn from the $V_{dd}$ supply is reduced to 7.39 mA, which is a 51% reduction.

The amount of power saving and the amount of peak current reduction are very encouraging and prove that our low power/low noise bus design can meet the requirement of future high performance low power circuit designs.

While the invention has been described particularly with respect to preferred embodiments thereof, it will be understood by those skilled in the art that modifications to the disclosed embodiments can be effected without departing from the spirit and scope of the invention.

I claim:

1. A circuit, comprising:
   a logic circuit having an input node and an output node, and means responsive to an input signal applied to the input node for producing an output signal the output node;
   a first voltage source coupled to the output node and producing a voltage of a first level;
   a second voltage source coupled to the output node and producing a voltage of a second level, greater than the first level;
   means for precharging the output signal to approximately the first level using the first voltage source, and then in a second step to approximately the second level using the second voltage source, wherein the second value is approximately twice the first value.

2. The circuit of claim 1, wherein the logic circuit has a signal propagation delay period, and wherein the output voltage is boosted to approximately the first level during the delay period.

3. The circuit of claim 2, wherein the output voltage is boosted to approximately the second level following the delay period.

4. A circuit, comprising:
   a logic circuit having an input, an output, and means for performing one or more logical operations on an input signal applied to the input and for producing an output signal at the output;
   means responsive to the input signal applied to the input for precharging the output of the circuit to approximately a first level during a first time interval prior to performance of logical operations on the input signal and for driving the output of the circuit to approximately a second level greater than the first level during a second time interval after the performance of logical operations on the input signal;
   wherein the means responsive to the input signal comprises a first voltage source producing a voltage equal to the first level, and a second voltage source producing a voltage about twice the first level.

5. The circuit of claim 4, wherein the first time interval is equal to a propagation delay between the time the evaluation signal is input to the logic circuit and the time the logic circuit produces the output signal.

6. A method for producing an output from a logic circuit having an input and an output, the logic circuit exhibiting a signal propagation delay between the time a signal is applied to the input and the time an output signal is produced at the output of the logic circuit, the method comprising the steps of:
   applying an input signal to the input;
   if the input signal has a first predetermined value:
   precharging the output to a first level prior to performing all logical operations on the input signal;
   when a period approximately equal to the propagation delay has elapsed since the step of applying the input signal was performed, and after all logical operations have been performed on the input signal, driving the output to a second voltage level at about twice the level of the first voltage level;
   if the evaluation signal has a second predetermined value, producing an output of a third voltage level less than the first level.

7. A method, comprising:
   providing a logic circuit having an input node, an output node and means responsive to a signal applied to the input node for producing a logic output signal at the output node;
   applying an input signal to the input node;
   in a first step, charging the output node to a first level of approximately a first value using a voltage source producing a voltage equal to the first value;
   in a second step, charging the output node to approximately a second level greater than the first level using a second voltage source producing a voltage equal to a second value, wherein the second value is about twice the first value.

8. A driver circuit having an input node and output node for driving said output node to a logic high state, said driver circuit being powered by a first power source at a first voltage level, said driver circuit comprising:
   a first transistor for connecting said output node to said first power source and for driving said output node toward said first voltage level;
   a second transistor for connecting said output node to a second power source having a voltage about one half of said first voltage and for driving said output node to said second power source voltage; and
   logic circuitry for connecting to said input node, said output node and said first and second transistors for driving said output node to said logic high state so that each of said first and second transistors drives about one half of said first voltage level.

* * * * *